(12) United States Patent
Stokes et al.

(10) Patent No.: US 6,917,057 B2
(45) Date of Patent: Jul. 12, 2005

(54) LAYERED PHOSPHOR COATINGS FOR LED DEVICES

(75) Inventors: Edward Stokes, Charlotte, NC (US); Donald Buckley, Jr., Schenectady, NY (US); Thomas McNulty, Ballston, NY (US); Daniel Doxsee, Sagamore Hills, OH (US)

(73) Assignees: GELcore LLC, Valley View, OH (US); General Electric Company, Schenectady, NY (US)

( * ) Notice: Subject to any disclaimer, the term of this patent is extended or adjusted under 35 U.S.C. 154(b) by 0 days.

(21) Appl. No.: 10/335,487

(22) Filed: Dec. 31, 2002

(65) Prior Publication Data

US 2004/0124429 A1 Jul. 1, 2004

(51) Int. Cl.[7] .......................... H01L 33/00; H01L 21/00
(52) U.S. Cl. .................. 257/98; 257/100; 257/103; 438/27; 438/29
(58) Field of Search ................ 257/98, 99, 100, 257/103; 438/26, 27, 29, 46

(56) References Cited

U.S. PATENT DOCUMENTS

| | | | |
|---|---|---|---|
| 5,739,554 A | 4/1998 | Edmond et al. | |
| 5,959,316 A | 9/1999 | Lowery | |
| 5,962,971 A | 10/1999 | Chen | |
| 6,084,250 A | 7/2000 | Justel et al. | |
| 6,120,600 A | 9/2000 | Edmond et al. | |
| 6,155,699 A | 12/2000 | Miller et al. | |
| 6,459,100 B1 | 10/2002 | Doverspike et al. | |
| 6,518,600 B1 * | 2/2003 | Shaddock | 257/98 |
| 6,576,931 B2 * | 6/2003 | Furukawa et al. | 257/98 |
| 6,580,097 B1 * | 6/2003 | Soules et al. | 257/100 |

FOREIGN PATENT DOCUMENTS

WO    WO 01/89000 A1    11/2001

\* cited by examiner

*Primary Examiner*—Mark V. Prenty
(74) *Attorney, Agent, or Firm*—Fay, Sharpe, Fagan, Minnich & McKee, LLP

(57) ABSTRACT

A light emitting device comprised of a light emitting diode on a mounting surface, the light emitting diode includes a substrate layer and at least one active region. A resilient substantially transparent and substantially phosphor free polymer layer extends from the mounting surface to above at least one quarter of a height of the substrate layer but below a top surface of the light emitting diode. A second phosphor containing layer extends from the phosphor free polymer layer to above the top surface of the light emitting diode.

26 Claims, 2 Drawing Sheets

LAYERED PHOSPHOR COATINGS FOR LED DEVICES

BACKGROUND OF THE INVENTION

This invention relates to light emitting devices including a light emitting diode in combination with a phosphor material. Light emitting diodes (LEDs) are well-known solid-state devices that can generate light having a peak wavelength in a specific region of the visible spectrum. Early LEDs emitted light having a peak wavelength in the red region of the light spectrum, and were often based on aluminum, indium, gallium and phosphorus semiconducting materials. More recently, LEDs based on Group III-nitride where the Group III element can be any combination of Ga, In, Al, B, and Tl have been developed that can emit light having a peak wavelength in the green, blue and ultraviolet regions of the spectrum.

Since these GaN based devices have a relatively short peak wavelength, the blue, green or UV light (the "primary light") generated by the GaN-based LEDs is often converted to produce light having a longer peak wavelength (the "secondary light") using a process known as photoluminescence emission. The photoluminescence emission process involves the absorbance of the primary light by a photoluminescent phosphor. The absorbed light excites the luminescent centers of the phosphor material, which then emit the secondary light upon relaxation. The peak wavelength of the secondary light will depend on the phosphor material. The type of phosphor material can be chosen to yield secondary light having a selected wavelength. Accordingly, the phosphor material may emit light at the wavelength of the overall device light color or the device light color may be achieved via a combination of emitted primary LED light and converted secondary phosphor light. As used in this description, the term phosphor material includes a luminescent material in loose or packed powder form and in solid crystalline body form).

With reference to FIG. 1. a prior art light emitting device 10 is shown. The light emitting diode 10 includes an LED 12 that generates blue primary light when activated. The LED 12 is positioned on a reflector cup lead frame 14 and is electrically coupled to leads 16 and 18. The leads 16 and 18 provide electrical power to the LED 12. The LED 12 is covered by a region 20 of phosphor material. The LED 12 and the phosphor region 20 are encapsulated by a lens 22. The lens 22 is typically made of an optically transparent epoxy, or silicone.

In operation, electrical power is supplied to the LED 12 to activate the semi-conducting layers, e.g. Group III-nitride. When activated, the LED 12 emits the primary light, e.g., blue light, away from the top surface of the LED 12. The emitted primary light is absorbed by the phosphor region 20. The phosphor region 20 then emits secondary light, i.e., the converted light having a longer peak wavelength, in response to absorption of the primary light. The secondary light is emitted randomly, or isotropically in various directions by the phosphor region 20. Some of the secondary light is emitted away from the GaN die 12, propagating through the lens 22 and exiting the light-emitting device 10 as output light. The lens 22 directs the output light in the general direction indicated by arrow 24.

According to the prior art design of FIG. 2, a light emitting device structure is shown in which a light emission chip 100 is placed in a V-shaped slot (generally called a cup) of a first electrode supporting frame 102. After connecting the conductors (not shown), a first resin 103 is coated on the V-shaped slot with its height slightly larger than the thickness of the light emission chip 100, a second resin 104 is coated on the first resin 103 after it has cured. A phosphor material capable of changing the length of light waves is mixed with the second resin 104. After the second resin 104 has dried, a third resin 105 is applied as a sealing enclosure for the entire structure to form a finished LED product.

Alternatively, light emitting devices have been provided wherein phosphor and LED are mounted to a top surface of a printed circuit board. According to the prior art design shown in FIG. 3, it is taught that the deposition of a transparent spacer 200 over and around the LED 202, separating a substantially uniform thickness layer of phosphor material 204 from the LED 202 will eliminate annular rings. It is also stated that the transparent spacer 200 can be exactly level with the top of the LED 202, such that the layer of phosphor material 204 is of a uniform thickness above the LED. The LED 202 is mounted on a printed circuit board 206. This too suffers from disadvantages including the failure to position phosphor advantageously close to the light emitting region of the LED.

In summary, the prior art has primarily combined phosphor material with an LED by dispersing the phosphor material in a matrix surrounding the LED ("conformal coating") or in a layer disposed above the LED ("remote coating").

Importantly, LEDs, particularly GaN type, can be divided into two sub-categories. Moreover, most GaN LEDs available today are provided either on a sapphire substrate layer or a silicon carbide substrate layer. For reasons known to the artisan skilled in the manufacture of GaN LEDs in these categories, silicon carbide substrated GaN LEDs typically have a thickness of nearly 2.5 times that of sapphire substrated LEDs. As utilized herein, the terms "thickness" and "height" reflect the dimension of the LED in the direction of arrow 301 in FIG. 4.

The present invention helps to address problems in conformal coating of a relatively thick substrate (e.g. silicon carbide) LED.

SUMMARY OF THE INVENTION

According to one embodiment of the invention, a light emitting device comprised of a light emitting diode on a mounting surface is provided. The light emitting diode includes a substrate layer comprised of silicon carbide and at least one active region. At least one generally resilient substantially transparent and substantially phosphor free polymer layer extends from about the mounting surface to above at least one quarter of the height of the substrate layer, and below a top surface of the light emitting diode. A phosphor containing layer extends from above the phosphor free polymer layer to above the top surface of the light emitting diode.

According to another embodiment of the invention, a method of manufacturing a light emitting device is provided. Furthermore, according to another embodiment, a light emitting device is provided wherein the present inventive design is utilized with a substrate layer having a thickness greater than 150 μm.

In accord with certain embodiments, the mounting surface can be a curved reflector body. Alternatively, the surface can be a printed circuit board and any intermediate heat sink, light reflective body or other desirable device component(s). According to a further embodiment, the substantially phosphor-free polymer layer is comprised of silicone, epoxy or a hybrid thereof. Exemplary hybrids may include silicon-epoxies. Similarly, the phosphor containing layer can be comprised of phosphor material in silicone, epoxy or a hybrid thereof, or as a suspension of phosphor material in a volatile organic solvent. According to a further embodiment, the above-described light emitting device will be encapsulated in a protective polymeric encapsulant.

DETAILED DESCRIPTION OF THE INVENTION

According to an exemplary embodiment, the invention pertains to a light emitting device including an LED and a phosphor material. In general, Group III-nitride based LEDs especially those on silicon carbide substrates are too tall to effectively apply a conformal coating, i.e. a coating of phosphor containing polymer around the entire exposed periphery of the LED. Particularly, phosphor coating of SiC substrated LEDs tends to result in a build up of phosphor around the base of the die where only a relatively small portion of the primary light is emitted. In fact, phosphor concentration adjacent to the SiC substrate layer may be higher than the adjacent LED light emitting regions as a result of phosphor settling during the matrix cure stage. Not only does an equal distribution of phosphor throughout the matrix result in inefficient light emission because the phosphor adjacent the substrate is exposed to very little primary light, but due to settling during cure, the area adjacent the LED substrate layer may actually have a higher phosphor concentration level. Consequently, conventionally conformal coated LEDs tend to suffer from relatively poor color uniformity and performance. One alternative to combat this poor performance is high phosphor loading, resulting in a correspondingly higher manufacturing cost. Too much phosphor may also diminish light output due to increased scattering.

In the present invention, a transparent material is first deposited adjacent the substrate layer of the LED. This limits the later deposited phosphor from building up at the base of the LED. A phosphor loaded material is then added over the transparent layer, positioning the phosphor in an advantageous location to absorb the LED light emissions. More particularly, the LED cup is partially filled with a substantially transparent material, e.g. silicone or epoxy, and cured. The silicone/epoxy fills in the region of the base of the cup where relatively small amounts of radiation are emitted. Following cure, the cup is filled with a phosphor loaded silicone, epoxy or a mixture thereof or a phosphor suspension in an organic carrier such as any low temperature volatile organic solvent, e.g. hexane, or an alcohol. Since the relative height of the chip has been reduced by the fill, it is easier to apply a conformal coating to the upper portion of the die where a majority of the radiation is emitted. Importantly, sufficient die coverage can be achieved with modest amounts of phosphor. For example, in a non-high power package type, less than about 0.01–0.1 mg phosphor per LED may be used.

Figure 1:
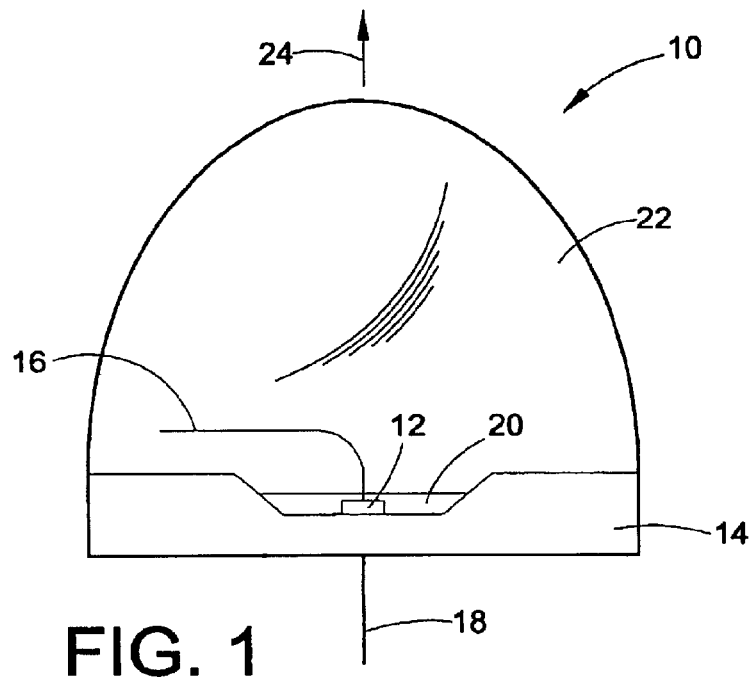
FIG. 1 is a prior art LED containing light emitting device.
Figure 2:
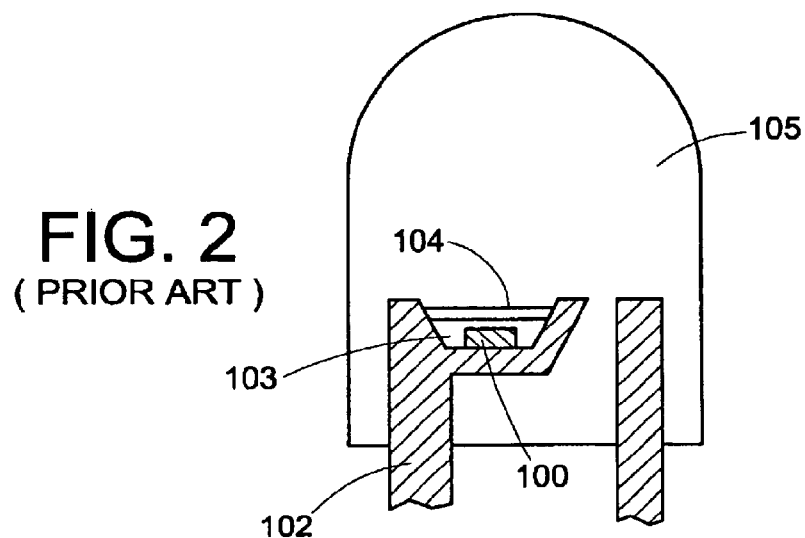
FIG. 2 is a prior art LED containing light emitting device.
Figure 3:
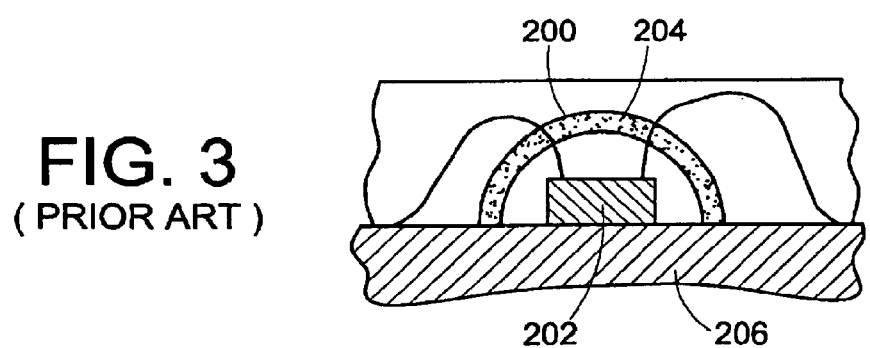
FIG. 3 is a prior art LED containing light emitting device.
Figure 4:
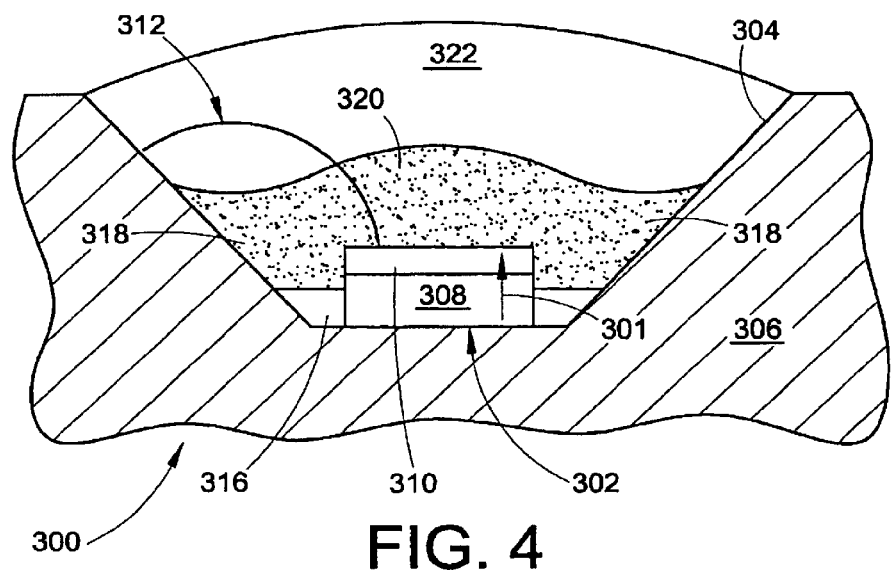
FIG. 4 is a LED containing light emitting device according to the invention, the LED residing in a reflector cup.

Referring now to FIG. 4, a light emitting device 300 is provided. The device 300 includes an LED 302 disposed within a reflector cup 304 formed in electrode layer 306. LED 302 includes substrate region 308-and an active region 310. Electrical lead 312 provides power to the LED 302. A layer of generally transparent, substantially phosphor free polymeric material 316 is disposed in reflector cup 304 adjacent the substrate region 308 of LED 302. Polymeric material layer 316 rises to a level, in the direction of arrow 301, just below the active region 310 of LED 302. Located above polymeric material layer 316 is a phosphor 318 containing layer 320. Phosphor containing layer 320 may be comprised of a polymeric material or an organic solvent. A lens component 322 encloses the reflector cup 304. The lens may be formed of any suitable material known to the skilled artisan such as an epoxy.

Figure 5:
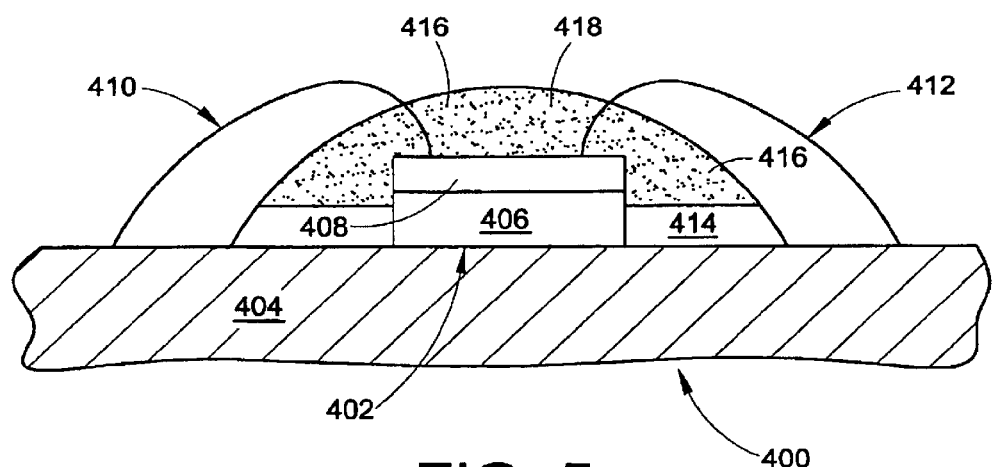
FIG. 5 is a LED containing light emitting device according to the invention, the LED being a surface mount design.

Referring now to FIG. 5, a surface mount embodiment 400 of the present invention is depicted. Particularly, an LED 402 is located on a printed circuit board 404. The LED 402 includes substrate region 406 and an active region 408. Leads 410 and 412 provide electrical power to the LED 402. A first substantially transparent, phosphor free polymeric material material 414 surrounds the substrate up to nearly the height of substrate layer 405. A phosphor 416 contains layer 418 is positioned thereabove adjacent active region 408.

The present invention is particularly advantageous because of the failure, to date, to develop a workable, commercially viable technique for producing bulk single crystals of Group III nitrides which could form appropriate substrates for Group III nitride photonic devices including light emitting diodes. As is known to those familiar with semiconductor devices, they all require some sort of structural substrate. Typically, a substrate formed of the same materials as the active region of a device offers significant advantages, particularly in crystal growth and matching. Because Group III nitrides have yet to be formed in such bulk crystals, however, Group III nitride photonic devices must be formed in epitaxial layers on different—i.e., other than Group III nitride substrates.

To date, a common substrate for Group III nitride devices has been sapphire, i.e., aluminum oxide ($Al_2O_3$). Sapphire is optically transparent in the visible and UV ranges, but is, unfortunately, electrically insulating rather than electrically conductive, and carries a lattice mismatch with (for example) gallium nitride of about 16%. In the absence of a conductive substrate, "vertical devices (those with contacts on opposite sides) cannot be formed, thus complicating the manufacture and use of the devices. For this and other reasons known to the skilled artisan, silicon carbide has become another commercially available GaN LED substrate material. Unfortunately, SiC must be formed at much greater thickness than sapphire.

For purposes of clarity, it is noted that the present invention is suitable for use in conjunction with any type of LED but may be most beneficially utilized with LEDs having a relatively thick substrate, e.g. a substrate layer greater than 150 $\mu$m. One example of these relatively thick substrates are those of silicon carbide. Gallium nitride LEDs on a silicon carbide substrate, for example those supplied by Cree Incorporated, are roughly 250 $\mu$m tall (roughly 2.5 times that of LEDs on a sapphire substrate). Exemplary silicon carbide substrate LEDs are available from Cree, Inc. of North Carolina and include models_UltraBright™, MegaBright™_and Xbright™.

While the present invention is suited for use with any type of light emitting device including those emitting red and yellow regions, it may be particularly beneficially when used with LEDs emitting in the green blue and/or UV regions where phosphor conversion is usually employed. Representative examples of green blue and/or UV emitting LEDs are those referred to as gallium nitride based.

One exemplary type of LED design provided for demonstration purposes only is the following: the materials made of $Al_xGa_yIn_{(1-x-y)}N$ where both X and Y is between 0 and 1 ($0 \leq X \leq 1, 0 \leq Y \leq 1$) and wherein a narrower bandgap GaN-based light-emitting structure is sandwiched between single or multiple layers of wider bandgap GaN-based structures with different conductivity types on different sides of the light-emitting structure.

Of course, the present invention is not limited thereto. Moreover, the present invention is believed beneficial with LEDs of any construction and, particularly those where a relatively thick substrate is utilized. Accordingly, the present invention can function with radiation of any wavelength provided phosphor compatibility exists. Similarly, the present invention is compatible with double heterostructure, multiple quantum well, single active layer, and all other types of LED designs. For example, the LED may contain at least one semiconductor layer based on GaN, ZnSe or SiC semiconductors. The LED may also contain one or more quantum wells in the active region, if desired. Typically, the LED active region may comprise a p-n junction comprising GaN, AlGaN and/or InGaN semiconductor layers. The p-n junction may be separated by a thin undoped InGaN layer or by one or more InGaN quantum wells.

The present invention can operate with any suitable phosphor material or combinations of phosphor materials. Moreover, provided that a phosphor which is compatible with the selected LED is used, the present invention can improve the device performance. Importantly, this means that no requirement exists in the invention with respect to the wavelength generated by the LED, the wavelength the phosphor excites or re-emits, or at the overall wavelength of light emitted by the light emitting device. Nonetheless, several exemplary phosphor systems are depicted below to facilitate an understanding of the invention.

Conventionally, a blue LED is an InGaN single quantum well LED and the phosphor is a cerium doped yttrium aluminum garnet ("YAG:Ce"), $Y3Al5O12:Ce^{3+}$. The blue light emitted by the LED is transmitted through the phosphor and is mixed with the yellow light emitted by the phosphor. The viewer perceives the mixture of blue and yellow light as white light. One alternative phosphor is a TAG:Ce wherein terbium is substituted for yttrium. Other typical white light illumination systems include a light emitting diode having a peak emission wavelength between 360 and 420 nm, a first $APO:Eu^{2+},Mn^{2+}$ phosphor, where A comprises at least one of Sr, Ca, Ba or Mg, and a second phosphor selected from at least one of:

a) $A_4D_{14}O_{25}:Eu^{2+}$, where A comprises at least one of Sr, Ca, Ba or Mg, and D comprises at least one of Al or Ga;
b) $2AO * 0.84P_2O_5 * 0.16B2O3):Eu^{2+}$, where A comprises at least one of Sr, Ca, Ba or Mg;
c) $AD_8O_{13}:Eu^{2+}$, where A comprises at least one of Sr, Ca, Ba or Mg and D comprises at least one of Al or Ga;
d) $A_{10}(PO_4)6Cl_2:Eu^{2+}$, where A comprises at least one of Sr, Ca, Ba or Mg; or
e) $A_2Si_3O_8 * 2ACl_2:Eu^{2+}$, where A comprises at least one of Sr, Ca, Ba or Mg.

Accordingly, the phosphor system may be a blend of materials. For example, a white light illumination system can comprise blends of a first phosphor powder having a peak emission wavelength of about 570 to about 620 nm and a second phosphor powder having a peak emission wavelength of about 480 to about 500 nm to form a phosphor powder mixture adjacent the LED.

Exemplary polymeric fillers include silicones, several examples of which are available from GE-Toshiba Silicones, which can be used interchangeably as the transparent fill layer or as the phosphor dispersion layer. In addition, it is contemplated that the dispersion layer can be phosphor suspension a volatile organic solution such as a low molecular weight alcohol. Advantageously, the filler layer, the phosphor containing layer and the optic lens element can be formed/assembled according to any techniques known to the skilled artisan.

As the skilled artisan will discern from the above description and the appended claims, the subject invention has been described according to certain selected embodiments, however, many modifications and alterations which nonetheless fall within the scope of the appended claims will be apparent.

We claim:

1. A light emitting device comprised of a light emitting diode on a mounting surface, said mounting surface comprises a curved reflector, said light emitting diode including a substrate layer comprised of silicon carbide and at least one active region, at least one resilient substantially transparent and substantially phosphor free polymer layer extending from said mounting surface to above at least one quarter of a height of the substrate layer and below a top surface of the light emitting diode, and at least a second layer containing phosphor extending from said phosphor free polymer layer to a height above a top surface of said light emitting diode.

2. The light emitting device of claim 1 wherein said polymer is selected from silicone, epoxy or hybrids thereof.

3. The light emitting device of claim 1 wherein said material containing said phosphor is selected from silicone, epoxy, or hybrid thereof, or volatile organic liquids or semi-liquids.

4. A light emitting device comprised of a light emitting diode on a mounting surface, said light emitting diode including a substrate layer comprised of silicon carbide and at least one active region, said substrate has a height of at least 150 μm, at least one resilient substantially transparent and substantially phosphor free polymer layer extending from said mounting surface to above at least one quarter of a height of the substrate layer and below a top surface of the light emitting diode, and at least a second layer containing phosphor extending from said phosphor free polymer layer to a height above a top surface of said light emitting diode.

5. The light emitting device of claim 1 wherein said active region comprises at least gallium and nitride.

6. A light emitting device comprised of a light emitting diode emitting lights between 360 and 420 nanometers on a mounting surface, said light emitting diode including a substrate layer comprised of silicon carbide and at least one active region, at least one resilient substantially transparent and substantially phosphor free polymer layer extending from said mounting surface to above at least one quarter of a height of the substrate layer and below a top surface of the light emitting diode, and at least a second layer containing phosphor extending from said phosphor free polymer layer to a height above a top surface of said light emitting diode.

7. A light emitting device comprised of a light emitting diode on a mounting surface and an encapsulant layer, said light emitting diode including a substrate layer comprised of silicon carbide and at least one active region, at least one resilient substantially transparent and substantially phosphor free polymer layer extending from said mounting surface to above at least one quarter of a height of the substrate layer and below a top surface of the light emitting diode, and at least a second layer containing phosphor extending from said phosphor free polymer layer to a height above a top surface of said light emitting diode.

8. A light emitting device comprised of a light emitting diode on a mounting surface, said light emitting diode including a substrate layer comprised of silicon carbide and at least one active region, at least one resilient substantially transparent and substantially phosphor free polymer layer extending from said mounting surface to above at least one quarter of a height of the substrate layer and below a top surface of the light emitting diode, at least a second layer containing phosphor extending from said phosphor free polymer layer to a height above a top surface of said light emitting diode, and said phosphor is selected from TAG:Ce, YAG:Ce and mixtures or derivatives thereof.

9. A method of manufacturing a light emitting device comprising mounting a light emitting diode on a surface, said light emitting diode having a substrate layer and at least one active region, providing an electrical connection to said light emitting diode, depositing a substantially transparent and substantially phosphor free polymer adjacent said mounting surface to a height between above at least one quarter of a height of the substrate layer and just below the active region of the light emitting diode, and depositing at least a second layer containing phosphor disposed in a carrier material on said phosphor free polymer layer to above a top surface of said light emitting diode.

10. The method of claim 9 wherein said substrate layer is comprised of SiC.

11. The method of claim 9 wherein said mounting surface comprises a curved reflector.

12. The method of claim 9 wherein said polymer and said carrier material are selected from silicone, epoxy or hybrids thereof.

13. The method of claim 9 wherein said carrier material is selected from silicone, epoxy, or hybrid thereof or volatile organic liquids or semi-liquids or mixtures thereof.

14. The method of claim 9 wherein said substrate has a height of at least 150 $\mu$m.

15. The method of claim 9 wherein said active region includes at least gallium and nitride.

16. The method of claim 9 wherein said LED emits light between 360 and 420 nanometers.

17. The method, of claim 9 further comprising depositing an encapsulant layer above said phosphor containing carrier material.

18. The method of claim 9 wherein said phosphor free polymer is least partially cured before depositing said carrier material.

19. A light emitting device comprised of a light emitting diode on a mounting surface, said light emitting diode including a substrate layer, a substantially transparent and substantially phosphor free polymer layer extending from said mounting surface to above at least one quarter of a height of the substrate layer and just below the active region of the light emitting diode, and a phosphor containing layer extending from said phosphor free polymer layer to a height above the top surface of said light emitting diode.

20. The light emitting device of claim 4 wherein said mounting surface comprises a curved reflector.

21. The light emitting device of claim 4 wherein said polymer is selected from silicone, epoxy or hybrids thereof.

22. The light emitting device of claim 4 wherein said material containing said phosphor is selected from silicone, epoxy, or hybrid thereof, or volatile organic liquids or semi-liquids.

23. The light emitting device of claim 4 wherein said active region comprises at least gallium and nitride.

24. The light emitting device of claim 4 wherein said light emitting diode emits lights between 360 and 420 nanometers.

25. The light emitting device of claim 4 further comprising an encapsulant layer.

26. The light emitting device of claim 4 wherein said phosphor is selected from TAG:Ce, YAG:Ce and mixtures or derivatives thereof.

* * * * *